United States Patent
Kuo

(10) Patent No.: US 6,771,539 B2
(45) Date of Patent: Aug. 3, 2004

(54) METHOD FOR OPERATING NON-VOLATILE MEMORY WITH SYMMETRICAL DUAL-CHANNELS

(75) Inventor: Tung-Cheng Kuo, Yilan Hsien (TW)

(73) Assignee: Macronix International Co., Ltd. (TW)

(*) Notice: Subject to any disclaimer, the term of this patent is extended or adjusted under 35 U.S.C. 154(b) by 56 days.

(21) Appl. No.: 10/229,105

(22) Filed: Aug. 28, 2002

(65) Prior Publication Data

US 2002/0196663 A1 Dec. 26, 2002

Related U.S. Application Data

(62) Division of application No. 09/994,767, filed on Nov. 28, 2001.

(30) Foreign Application Priority Data

May 9, 2001 (TW) .......................................... 90111090 A

(51) Int. Cl.[7] .............................................. G11C 16/04
(52) U.S. Cl. ............................. 365/185.18; 365/185.01; 365/189.01
(58) Field of Search ....................... 365/185.18, 189.01, 365/185.01

(56) References Cited

U.S. PATENT DOCUMENTS

| | | | |
|---|---|---|---|
| 5,965,919 A | 10/1999 | Yoo .......................... 257/351 |
| 6,344,994 B1 | 2/2002 | Hamilton et al. ....... 365/185.05 |
| 6,385,089 B2 * | 5/2002 | Sung et al. ............. 365/185.18 |
| 6,525,969 B1 * | 2/2003 | Kurihara et al. ........ 365/185.25 |
| 6,594,180 B2 * | 7/2003 | Pascucci ................. 365/185.18 |
| 2002/0131304 A1 * | 9/2002 | Ogura et al. ............ 365/185.28 |

* cited by examiner

Primary Examiner—Van Thu Nguyen

(57) ABSTRACT

A method for operating a non-volatile memory with symmetrical dual-channels. A programmed step is performed on the non-volatile memory to retain charges in both sides of an ONO layer so that the symmetrical dual-channels are generated and the one-bit writing step is completed. Afterwards, a selected voltage is simultaneously exerted on a first bit line and a third bit line to select a second bit line of the symmetrical dual-channels. Finally, a reading voltage is applied to the second bit line to acquire a reading current which is the sum of total current through the symmetrical dual-channels for increasing the reading speed of the non-volatile memory.

8 Claims, 2 Drawing Sheets

METHOD FOR OPERATING NON-VOLATILE MEMORY WITH SYMMETRICAL DUAL-CHANNELS

This application is a Divisional of application Ser. No. 09/994,767 filed Nov. 28, 2001.

FIELD OF THE INVENTION

The present invention generally relates to a method for operating non-volatile memory, and more particularly, to a method for operating non-volatile memory with a symmetrical dual-channels.

BACKGROUND OF THE INVENTION

With the rapid developments of electronic industry and computer technology, the electronic products are widely used in daily routines and improve the quality of the life. Generally, a variety of memories are utilized in many electronic products to provide temporary space for switching and storing data. On the one hand, the nonvolatile characteristic of the flash memory allows repeated writing to record the data status, but the flash memory does not need a power supply and periodic refreshing. On the other hand, due to improvements in the flash memory's structure and semiconductor techniques, the flash memory can accumulate a great number of cells since the dimensions of the integrated circuits (ICs) are greatly reduced.

The size reduction of the device may also shrink the data signal, with the result that the reading speed decreases the overall performance of the flash memory. Even charges stored in the cell are lost such that the cell's life is reduced when a higher drain voltage is employed. More severely, the reading speed of data signals is read in proportion to the reading current through the memory cell, so the reading speed may be slower due to the minimized reading current.

Conventionally, for the same channel length of memory cell, even a small increase in the channel length to enhance the reading current greatly increases the circuit size, resulting in the increment of the IC's integrity. FIGS. 1A–1B show a local view and the cross-sectional views along the A—A line of the flash memory's cell.

An ONO layer 102 is formed on the substrate 100, and the bit lines 106 are formed thereon by an ion implanting process. In the same time, a bit diffusion oxide 108 is formed on the bit lines 106. Thereafter, a polysilicon layer, used as word line 104, is fabricated on the ONO layer 102 and the bit lines 106 to construct the flash memory array. The conventional flash memory's cell 110 comprises a first bit line 106a and a second bit line 106b, and the charges are trapped near the sides of the two bit lines 106a, 106b.

During a reading operation, the charges 112a near the first bit line 106a of ONO layer 102 are read in turn. Afterwards, the charges 112b near the second bit line 106b of ONO layer 102 are also read. The reading mode of the cell is bit line by bit line to acquire the data status, and the reading current only comes from a single path 114, such as channel 116, so that the reading current is severely minimized. If the reading current through each of channel is increased, the reading voltage imposed on the first bit line 106a and the second bit line 106b must also be increased such that the charges stored will be mostly lost.

Consequently, the reading current induced from the conventional flash memory mode is too small to enhance reading speed. Additionally, at the same reading speed corresponding to a higher reading voltage, the operation numbers decrease leading to a reduction in the flash memory's life.

SUMMARY OF THE INVENTION

A problem encountered with the conventional flash memory is that the reading current thereof is extremely small so that the reading speed is decreased. Moreover, imposition of a higher reading voltage on the flash memory's cell reduces the operation life thereof.

As a result, the primary object of the present invention is to utilize the flash memory with dual-channels to increase the reading current, thereby effectively increasing the reading speed of the flash memory.

Another object of the present invention is to use a lower reading voltage corresponding to an optimum reading current to prevent charges from running off, and to increase the operation rates of the flash memory.

According to the above objects, the present invention sets forth a method of operating a flash memory with symmetrical dual-channels. An ONO layer is formed on the substrate. Afterwards, bit line patterns are defined by lithography and etching processes, and then an ion implanting process is performed to form bit lines on the substrate according to the bit lines pattern. After that, the bit line diffusion oxide is formed on the bit lines. Finally, a polysilicon layer is formed on the ONO layer and the bit lines to generate the flash memory having unit cells with symmetrical dual-channels. Specifically, the operation modes of flash memory with symmetrical dual-channels essentially comprise writing and reading procedures.

During the writing procedure, a writing voltage is applied to the second bit line to program electrically the unit cell with symmetrical dual-channels and charges are retained in both sides of the second bit lines to indicate the data status. Thereafter, both a first bit line and a third bit line are grounded. Next, a positive voltage is imposed on the second word line. Finally, both a first word line and a third word line are grounded. A critical voltage is induced by these retained charges to complete a bit writing process.

During the reading procedure, a selective voltage is added to the first bit line and the third bit line to select the second bit line with symmetrical dual-channels. Then, the second bit line is grounded. After that, the reading voltage is exerted on the second bit line to fetch the reading current which is the sum of total current through the symmetrical dual-channels for increasing the reading speed of the flash memory.

In the present invention, the method for operating the non-volatile memory with symmetrical dual-channels is used to simultaneously output reading currents that enhance the reading speed of the data signals. Alternatively, a lower reading voltage corresponding to the optimum reading current increases the operation rates of the flash memory.

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein.

DETAILED DESCRIPTION OF THE PREFERRED EMBODIMENT

The present invention is directed to a method of operating non-volatile memory, such as nitride read only memory (NROM), with symmetrical dual-channels, to simultaneously output a reading current from the dual-channels thereby enlarging the flash memory's reading speed. Further, a lower reading voltage corresponding to an optimum reading current is used to prevent charge run off and to increase the operation rates of the flash memory.

Figure 1A:
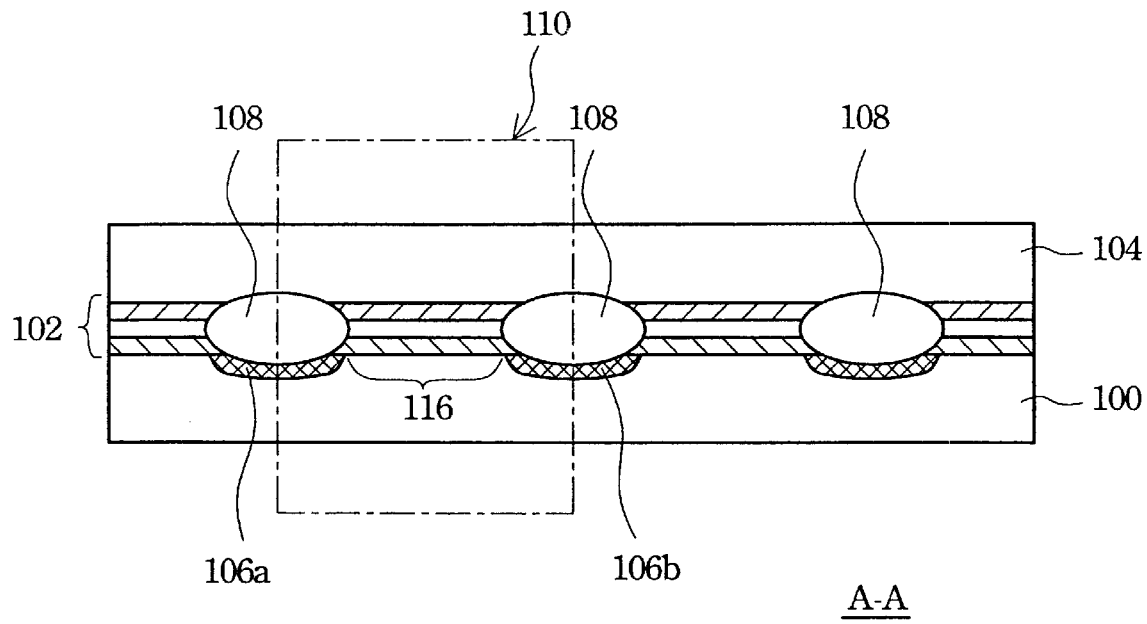
FIG. 1A illustrates a cross-sectional view of a conventional flash memory cell.
Figure 1B:
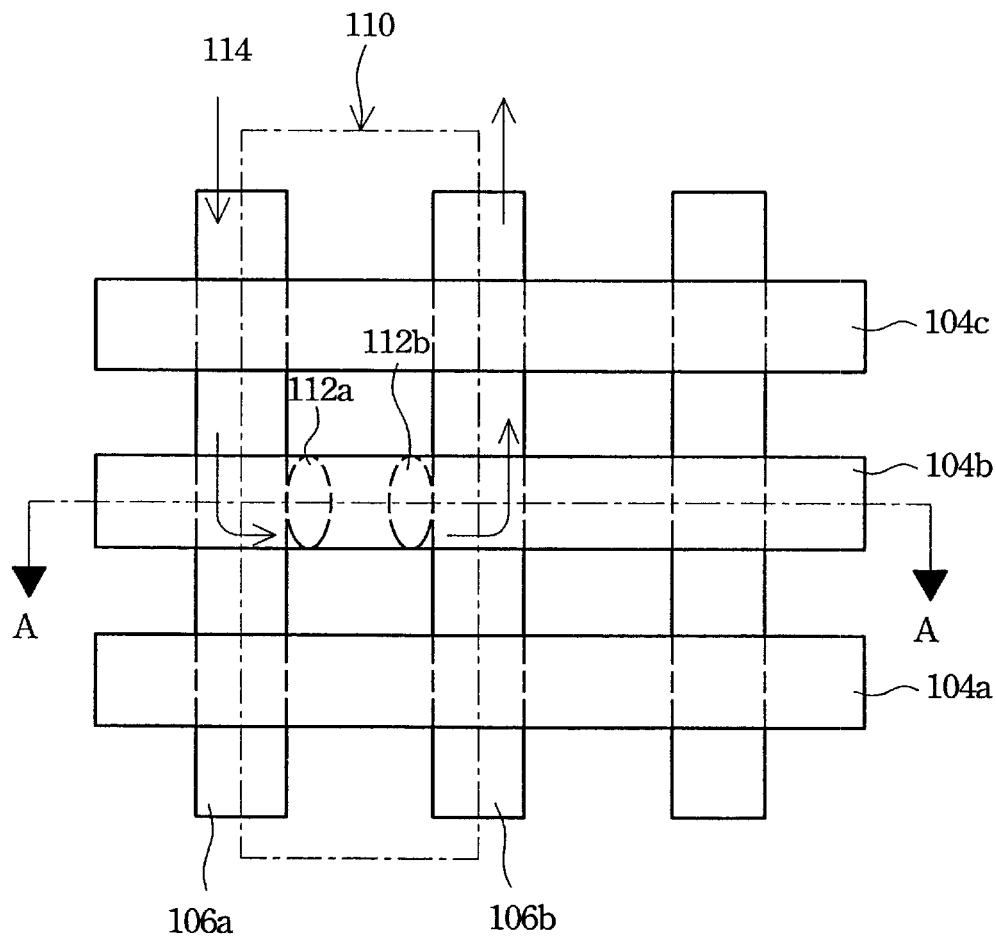
FIG. 1B illustrates a layout view of the conventional flash memory.
Figure 2A:
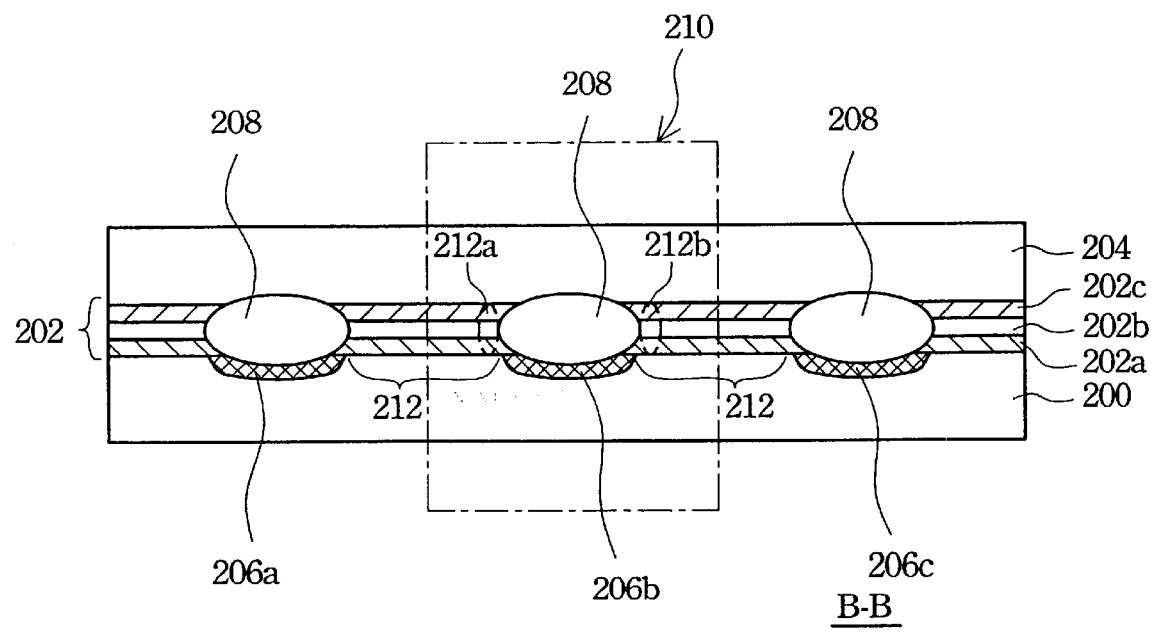
FIG. 2A illustrates a cross-sectional view of a flash memory with symmetrical dual-channels in accordance with the present invention.
Figure 2B:
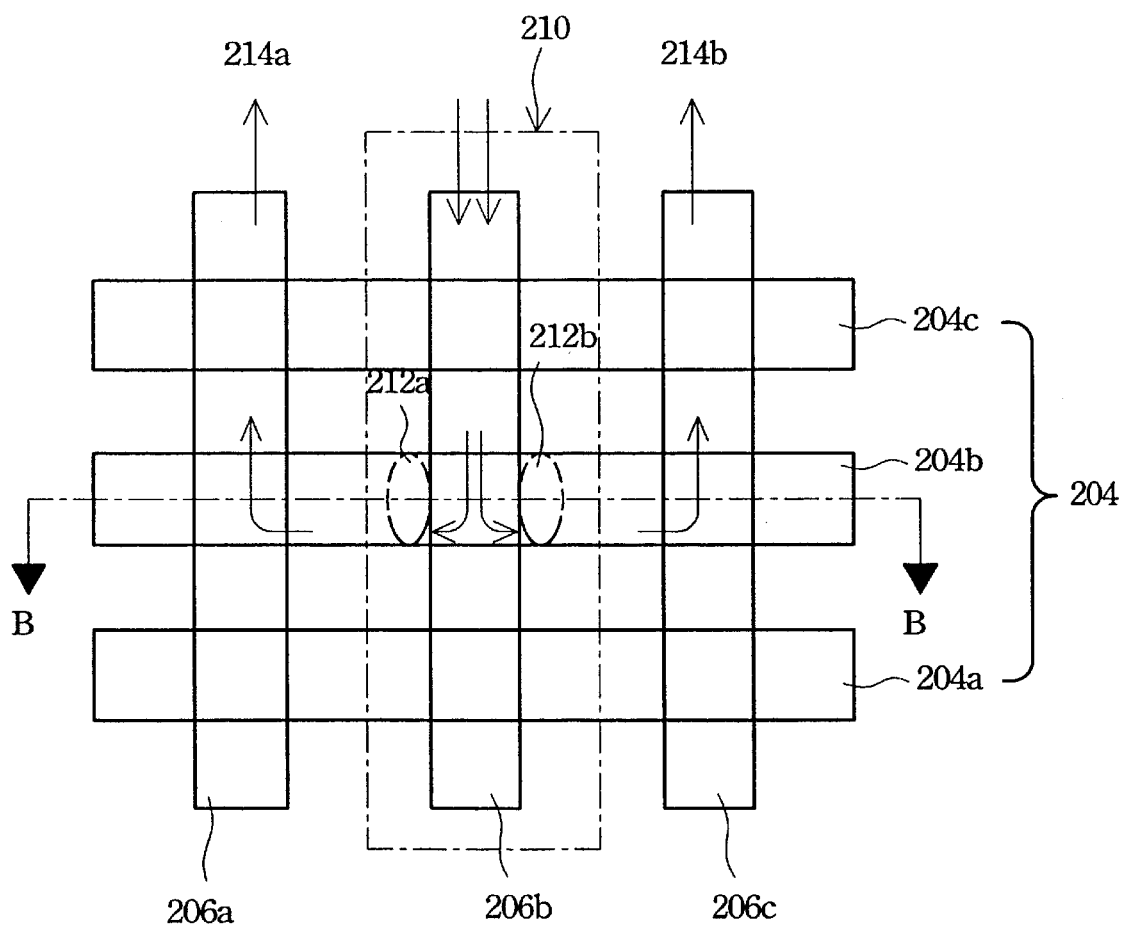
FIG. 2B illustrates a layout view of the flash memory with symmetrical dual-channels in accordance with the present invention.

FIGS. 2A–2B show a cross-sectional view and a layout view of the flash memory with symmetrical dual-channels in accordance with the present invention. First, an ONO layer 202, having a first oxide layer 202a, a nitride oxide layer 202b and a second oxide layer 202c, is formed on a substrate 200. Preferably, the first oxide layer 202a has a thickness between about 50 and 90 angstroms, the nitride oxide layer 202b has a thickness between about 30 and 70 angstroms, and the second oxide layer 202c has thickness between about 60 and 100 angstroms. Afterwards, bit line patterns are defined by lithography and etching processes, and then an ion implanting process implanting, for example, N+ ions, is performed to form bit lines on the substrate according to the bit line patterns. After that, a bit line diffusion oxide is formed on the bit lines by, for example, thermal oxidation. Finally, a polysilicon layer, using as a word line 204 is formed on the ONO layer 202 and the bit lines (206a–206c) to generate unit cell 210 with symmetrical dual-channels.

While the cell 210 is being programmed, a writing voltage is applied to the second bit line 206b. The writing voltage electrically programs the unit cell 210 with symmetrical dual-channels. The charges are retained in both sides (212a, 212b) of the second bit line 206b, which charges form a dual-channel structure to represent data status. Thereafter, both a first bit line 206a and a third bit line 206c are grounded. Next, a positive voltage is imposed on the second word line 204b. Finally, both a first word line 204a and a third word line 204c are grounded. A critical voltage is induced by the charges retained to complete the writing step of a bit. The writing voltage is between about 4 and 10 volts, and preferably is about 6 to 8 volts. In addition, the positive voltage is between about 8 and 13 volts, and preferably is about 10 to 12 volts.

Charges, trapped in the channel 212, are attracted to an electrical isolation layer, such as silicon nitride layer 202b, by an electrical field during a writing process. The electrical fields collect charges in both sides of the second bit line 206b to generate the critical voltage.

While the cell 210 is read, a selective voltage is applied to the first bit line 206a and the third bit line 206c to select the second bit line 206b with symmetrical dual-channels. Then, the second bit line 206b is grounded. After that, the reading voltage is exerted on the second word line 204b so as to fetches the reading current. The reading current is the sum of total current through the path (214a, 214b) of the symmetrical dual-channels 212 for increasing the reading speed of the flash memory. Thereafter, both a first word line 204a and a third word line 204c are grounded. The selective voltage is between about 1.2 and 2.4 volts, and preferably is about 1.3 and 1.9 volts. In addition, the reading voltage is between about 2.0 and 3.5 volts, and preferably, is about 2.2 to 3.2 volts.

Since charges are retained in both sides of the second bit line 206b, which construct a cell 210 with symmetrical dual-channels 212, the reading current ($I_R$) can be concurrently acquired through the symmetrical dual-channels 212 to get a volume current which is higher than that of single channel while a reading voltage ($V_R$) is imposed on the second bit line 206b. In other words, during the reading process, the current status within the dual-channels can be detected to show the charges status corresponding to the reading operation.

In general, the charges retained inside the ONO layer 202 are able to induce a critical voltage including a high threshold voltage and a low threshold voltage. The high threshold voltage shows the higher level and the low threshold voltage shows lower level with respect to data status. Additionally, the high threshold voltage retards the current and the low threshold voltage effectively accelerates the current.

Moreover, a driving voltage, indicating the range of reading voltage and critical voltage, is used to dominate the total current. Under the same reading current ($I_R$), a lower reading voltage imposed on the cell can prevent charge loss. Namely, the reading voltage is maintained in the largest voltage difference between the high threshold voltage and the low threshold voltage, respectively, with the largest voltage difference corresponding to an optimum reading current. As a result, the operation rates of flash memory with dual-channels can be increased by acquiring a higher reading current or by decreasing the reading current to an optimum reading current corresponding to a preferred reading voltage.

During the programming process, the above-mentioned steps can be adjusted according to various requirements and designs and still be completed. In addition, the voltage values used in the steps adapt to an optimum range depending on process techniques, design rules, oxidation, and the thickness of dielectric layer of device.

In the preferred embodiment of the present invention, in light of the sustained capability of the device, the reading voltage is between about 2.5 and 2 volts. Preferably, the high threshold voltage ($V_H$) is between about 4 and 3.5 volts and the low threshold voltage ($V_L$) is between about 1.6 volts and 0.9 volts. More preferably, the driving between the reading voltage and low threshold voltage has a range of about 1.0 volt to 1.4 volts, and the reading current has a range of about 50 to 60 $\mu A$.

In summary, the method for operating the non-volatile memory with symmetrical dual-channels 212 is used to simultaneously output reading current that enhances the reading speed of the data signals. Alternatively, a lower reading voltage corresponding to the optimum reading current increases the operation rates of the flash memory.

As is understood by a person skilled in the art, the foregoing preferred embodiments of the present invention are illustrative rather than limiting of the present invention. It is intended that various modifications and similar arrangements be included within the spirit and scope of the appended claims, the scope of which should be accorded the broadest interpretation so as to encompass all such modifications and similar structure.

What is claimed is:

1. A reading method for operating a non-volatile memory with symmetrical dual-channels, comprising:

applying a selective voltage to a first bit line and a third bit line to select a unit cell having symmetrical dual-channels which retain a plurality of charges in both sides of a second bit line having an ONO layer;

grounding said second bit line;

applying a reading voltage to a second word line to fetch a reading current through said symmetrical dual-channels; and grounding a first word line and a third word line.

2. The reading method of claim 1, wherein said non-volatile memory comprises NROM.

3. The reading method of claim 1, wherein said selective voltage has a range of about 1.2 to 2.4 volts.

4. The reading method of claim 1, wherein said reading volts have a range of about 2.0 to 3.5 volts.

5. The reading method of claim 1, wherein said critical voltage comprises a high threshold voltage and a low threshold voltage.

6. The reading method of claim 5, wherein said low threshold voltage has a range of about 1.6 volts to 0.9 volt.

7. The reading method of claim 6, wherein a driving voltage indicating a difference between said reading voltage and said critical voltage has a range of about 1 to 1.4 volts.

8. The reading method of claim 7, wherein a driving current corresponding to said driving voltage has a range of about 50 to 60 $\mu$A.

* * * * *